United States Patent [19]

Langberg

[11] Patent Number: 5,703,904
[45] Date of Patent: Dec. 30, 1997

[54] IMPULSE NOISE EFFECT REDUCTION

[75] Inventor: Ehud Langberg, Ocean, N.J.

[73] Assignee: Globespan Technologies, Inc., Red Bank, N.J.

[21] Appl. No.: 586,008

[22] Filed: Dec. 29, 1995

[51] Int. Cl.$^6$ .............................. G06F 17/10; H04B 1/10
[52] U.S. Cl. ............................... 375/232; 364/724.19
[58] Field of Search .................................. 375/229, 230, 375/232, 348, 317, 350; 364/724.01, 724.19, 724.2; 379/406, 410, 411

[56] References Cited

U.S. PATENT DOCUMENTS

| | | | |
|---|---|---|---|
| 4,462,048 | 7/1984 | Ross | 358/336 |
| 4,672,630 | 6/1987 | Kaku | 375/13 |
| 4,754,419 | 6/1988 | Iwata | 364/724 |
| 5,517,527 | 5/1996 | Ya | 375/233 |
| 5,559,840 | 9/1996 | Melas et al. | 375/355 |
| 5,602,869 | 2/1997 | Scott | 375/272 |

FOREIGN PATENT DOCUMENTS

| | | |
|---|---|---|
| 63-149950 | 6/1988 | Japan. |
| 63-294020 | 11/1988 | Japan. |

*Primary Examiner*—Stephen Chin
*Assistant Examiner*—Kevin Kim
*Attorney, Agent, or Firm*—Thomas, Kayden, Horstemeyer & Risley

[57] ABSTRACT

In a receiver system embodying the invention, the amplitude of the input signal is sensed so that when it exceeds a predetermined level, the adaptation of adaptive filters employed in the receiver is inhibited. In one embodiment of the invention the adaptation is inhibited for the extent of time that the sensed signal exceeds the predetermined level. In another embodiment of the invention, the adaptation is inhibited for a fixed period of time whenever the sensed signal exceeds the predetermined level. In still another embodiment of the invention, where the noise impulse has some repetitive pattern, an inhibiting signal is generated in anticipation of a repetitive noise impulse to inhibit adaptation of the adaptive filters during the period of time ("window") the noise impulse occurs.

27 Claims, 4 Drawing Sheets

DATA DRIVING TIMING RECOVERY TRANSCEIVER CIRCUIT

IMPULSE NOISE EFFECT REDUCTION

This invention relates to data communication systems and, in particular, to a receiver system in which the effect of noise impulses (e.g., noise spikes) is reduced.

The occurrence and presence at the input of a receiver of unwanted noise impulses (e.g., noise spikes) having significantly greater amplitude (and energy) than the desired data signals being transmitted presents numerous problems.

Known receiver systems include adaptive equalizers such as a decision-feedback equalizer (DFE) for compensating for noise and distortion introduced in the transmission channel between a transmitter and its receiver. A DFE may typically include an adaptive feed-forward filter and an adaptive feedback filter. A noise impulse (e.g., an unwanted noise spike) produces a significant problem in the adjustment of the coefficients of the adaptive filters of a DFE. Typically, a noise impulse can occur either during the "training" phase of the DFE or during the data transmission (steady-state) phase of the DFE. The problem due to a noise impulse is more acute during training because the adaptive filters are normally adjusted using larger steps during that phase. However, the problem is always present. During the data transmission phase, the DFE is also prone to "error propagation" because a slicer circuit in the DFE makes a decision i.e., an estimate, as to the correct data symbol. Since the DFE utilizes feedback, an incorrect estimate as to the current received symbol affects subsequent received symbols. The net effect of a noise impulse is to cause the coefficients of the adaptive filters to be misadjusted (i.e., improperly and incorrectly adjusted) which, in turn, causes the adaptive filters to propagate erroneous information.

In full duplex systems there is also included echo canceler circuitry between the transmitter and the receiver. Typically, an echo canceler is connected between the transmitter (TR) section and the receiver (REC) section. The echo canceler is an adaptive transversal filter that adaptively learns the response of the hybrid, and generates a replica of that response which is subtracted from the hybrid output to yield an echo-free received signal. Clearly, any large noise impulse injected into the receiver line during the training and/or during data transmission of the echo canceler corrupts the response of the canceler for an extended period of time. The net effect of a noise impulse is to cause the coefficients of the echo canceling filter to be misadjusted (i.e., improperly and incorrectly adjusted) which, in turn, causes the adaptive filters to propagate erroneous information.

In the case of the echo canceler filter and the adaptive equalizer, a large noise impulse causes the propagation of errors within their respective filters. However, the error levels decrease over time due to the adaptive nature of the filters.

Transmitter-receiver systems also include certain precoding filters such as the tomlinson precoding, which are "set" (e.g., their filter coefficients are updated and adjusted by a DFE) during certain phases (i.e., during training or immediately thereafter). Once "set", these filters remain set throughout a subsequent data transmission phase. Obviously, if a noise impulse is injected in the system during the training of such filters, the filter will be improperly set throughout the subsequent data transmission phase and the transmitted data will contain a high degree of noise and errors.

The noise impulse may thus adversely affect the setting of adaptive filters employed in various sections of a receiver and its associated transmitter. In brief, impulse noise distorts the filter response resulting in degradation of the receiver's performance. This effectively limits the maximum distance between a transmitter and receiver to produce reception with acceptable noise levels. Accordingly, it is an object of the invention to reduce the adverse effect of a noise impulse injected into a receiver.

SUMMARY OF THE INVENTION

In a receiver system embodying the invention, the amplitude of the input signal is sensed so that when it exceeds a predetermined level, the adaptation of adaptive filters employed in the receiver is inhibited. In one embodiment of the invention the adaptation is inhibited for the extent of time that the sensed signal exceeds the predetermined level. In another embodiment of the invention, the adaptation is inhibited for a fixed period of time whenever the sensed signal exceeds the predetermined level. In still another embodiment of the invention, where the noise impulse has some repetitive pattern, an inhibiting signal is generated in anticipation of a repetitive noise impulse to inhibit adaptation of the adaptive filters during the period of time ("window") the noise impulse occurs. In certain embodiments of the invention, the received signal is supplied to an input of a delay line whose output is coupled to adaptive filter means. A threshold detector senses the signal at the input to the delay line and produces a control signal for inhibiting the adjustment of the adaptive filter means when the signal exceeds a predetermined threshold level. Therefore, a received signal exceeding the threshold level does not affect the adjustment of the adaptive filter means.

BRIEF DESCRIPTION OF THE DRAWING

In the accompanying drawing like reference characters denote like components.

DETAILED DESCRIPTION OF THE INVENTION

Figure 1:
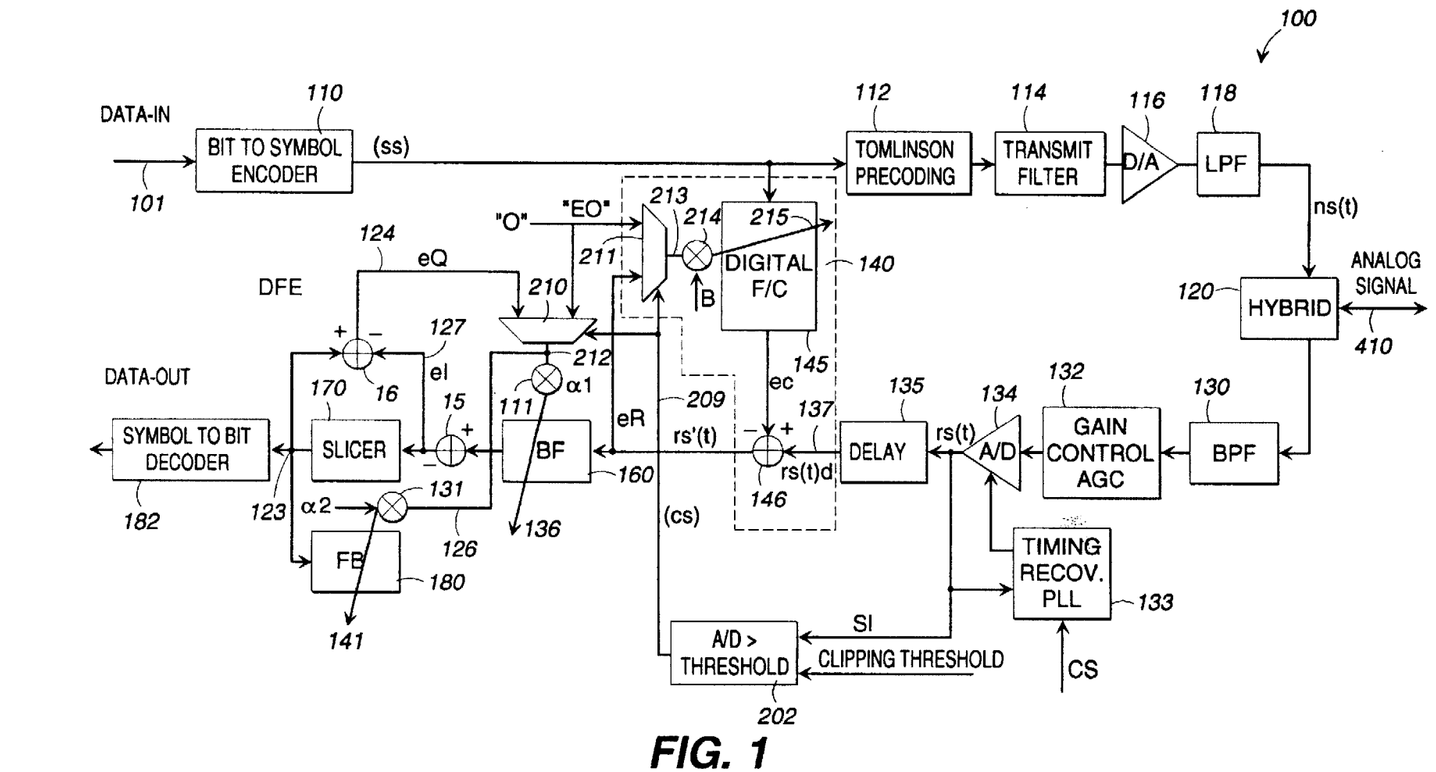
FIG. 1 is a block diagram of a portion of a receiver system embodying the invention.

FIG. 1 illustrates the structure of a modem 100, including echo canceling, modified in accordance with the invention. A binary input data sequence present on line 101 is first processed by a bit-to-symbol encoder 110 which outputs a sequence of complex-valued symbols (SS) at a nominal rate 1/T symbols per second, which are representative of the input data sequence and may also include scrambling redundancy and other forms of encoding. Symbol sequence {SS} is then processed by a tomlinson precoding circuit 112 followed by a transmit shaping filter 114, the output of which is applied to a digital-to-analog converter (D/A) 116. The resulting analog signal is filtered by a low-pass filter (LPF) 118, forming a near-end transmittal signal, ns(t). The latter is coupled into transmission channel 410 by hybrid 120. Illustratively, channel 410 is a twisted-pair or two-wire loop, that is typically connected to a central office (not shown).

In the other direction of communication, an analog line signal transmitted from a far modem (not shown) is received by hybrid 120 and is directed to bandpass filter (BPF) 130. This signal is referred to as the "far-end data signal," and utilizes the same frequency band as the transmitted signal i.e., modem 100 is a full-duplex modem. The output of bandpass filter 130 which removes energy outside the signal passband from the far-end data signal, is applied to automatic gain control (AGC) circuit 132 which functions to adjust the received signals within a desired range and whose output is fed to the input of analog-to-digital (A/D) converter 134 which converts the received signal to digital form and forms a received signal rs(t). Note that AGC circuit 132 adjusts the received signal such that normal received signals will not trigger detector 202 described below.

The signal reaching the input of bandpass filter 130 is corrupted by so called near and far echoes. The near echoes comprise transmit signal energy which, rather than having been directed to the channel by hybrid 120, has leaked through the hybrid. The far echoes are comprised of signal energy which was directed onto channel 410 in the first instance but was reflected back to the modem as the result, for example, of impedance mismatches and other channel anomalies. The received signal rs(t) provided at the output of A/D converter 134, thus contains not only energy from the far-end data signal, but also near and far echo energy. A/D 134 is "strobed" by a clock signal which is part of timing recovery circuit 133 to produce sampled signals at its output. The output of A/D 134 is connected to one input of delay network 135 and to one input of a threshold detector 202. Detector 202 may be any one of a number of analog or digital comparators.

A clipping threshold signal is applied to another input of threshold detector 202; where the clipping (threshold) level may be a voltage level or a digital equivalent. Detector 202 compares the amplitude of the signal it receives from A/D 134 (which is proportional to the amplitude of the signal received of the input to the receiver) and compares it to the threshold (clipping) level. The threshold (clipping) level is set to a value above which there is no acceptable data signals. That is, when the value of the clipping (threshold) level is exceeded it is indicative that unwanted and excessive impulse (or noise) is present at the receiving input. The threshold detector 202 produces a control signal (CS) on line 209 which has a first value when its signal input (SI) is below the clipping level and has a second value when its input signal (SI) is above the clipping level. When the control signal (CS) output of detector 202 has the first value, the adaptive equalizer and the echo canceler function in their normally expected fashion, as known in the prior art. However, when the CS output of detector 202 has the second value adaptation of the adaptive filters in the DFE and in the echo canceler is inhibited.

The output of the threshold detector 202 is supplied via line 209 to the control line of multiplexers 210 and 211.

Multiplexer 210 is a two input selection gate having a first input to which is applied the error signal (eQ) of the DFE and a second input to which is applied a constant signal "EO". The signal "EO" corresponds to a value of eQ which is generated when there is zero error signal; i.e., that value of eQ which indicates that there is no error present and that the coefficients of the adaptive feed-forward filter (FF) 160 and of the feedback filter (FB) 180 should not be changed and, hence, that they should be maintained at their previous value.

Multiplexer 211 is also a two input selection gate having a first input to which is applied the error signal (eR) of the echo canceler and a second input to which is applied a constant signal "EO". As in the case of the DFE, the signal EO applied to multiplexer 211 corresponds to the value of eR which is generated when there is zero error signal; i.e., that value of eR which indicates that there is no error present and that the coefficients of echo filter 145 should not be changed. When CS has a first value, eQ is coupled to the output line 212 of MUX210 and eR is coupled to the output line 213 of MUX211. When CS has a second value "EO" is coupled to the output lines of MUX210 and MUX211.

For propagating the received signal, the output of A/D 134 is coupled via a delay network 135 onto line 137 which is connected to one input of adder 146. The signal on line 137 will be the same as signal rs'(t) but delayed by the delay of network 135. The delay network 135 delays the propagation of the received signal long enough to enable the threshold detector 202 to sense the amplitude of the signal at the output of A/D 134 and produce a signal CS having a second value to inhibit the "adjustment" of the adaptive filters (e.g., 145, 160 and 180) of the receiver system wheneever the amplitude of the signal at the output of A/D 134 exceeds a predetermined value; i.e., the threshold (clipping).

Accurate recovery of the data represented by the far-end data signal requires that the echo energy present in the samples on lead 137 be removed. To this end, echo canceler 140 processes received signal rs(t). Echo canceler 140 may include a near-end and a far-end echo canceler. For purpose of simplicity, only one is shown. Echo canceler 140 comprises echo canceler 145 and adder 146. Echo canceler 145 forms an echo estimate (ec) which approximates the actual near (far) echo signal present in received signal rs(t). Echo canceler 145 is essentially an adaptive filter whose transfer function is adaptively determined so as to emulate the "echo path", i.e., all filtering operations encountered by the locally transmitted symbol sequence (ss) from tomlinson precoding 112 and transmit filter 114 through A/D converter 134. At adder 146, (ec) is subtracted from rs(t) so as to produce a substantially echo-free signal, rs'(t). The output of adder 146 is denoted herein and in the appended claims as an error signal (eR) used to adjust and update the coefficient of echo canceler 145.

The rs'(t) signal consists primarily of the far-end signal, plus any noise introduced by the channel and the various receiver elements (e.g., quantization error introduced by analog-to-digital converter 134).

In FIG. 1 the rs'(t) signal, also denoted as eR, is supplied to one input of multiplexer 211. When a control signal (cs) on control line 209 indicates that the noise level is below the clipping threshold level multiplexer 210 passes the eR signal onto its output line 213. The eR signal then adapts filter 145 via multiplexer 214 which multiplies the error signal (eR) by a constant or step size $\beta$. The resultant signal on line 215 is used to adapt filter 145.

Further processing of signal rs't is performed by an adaptive equalizer which in FIG. 1 has the form of a decision feedback equalizer (DFE). The DFE includes a feed-forward filter (FF) 160 whose output is supplied to one input of an adder 15. FF 160 functions to remove intersuymbol interference (ISI) from the signal propagated therethrough. The output of an adaptive feedback filter 170 is applied to another input of adder 15 which, theoretically, subtracts the remaining portion of ISI from the output signal of FF 160. The output of adder 15 is supplied to the input of slicer 170 and one input of an adder 16.

Slicer 170 selects a particular data symbol as a function of the mapping of the signal el at the output of adder 15 to a point in a predefined constellation of data symbols (not shown). Slicer 170 provides a data symbol every T seconds, where 1/T is the data symbol rate. This data symbol is an estimate of the received symbol and is provided by slicer 170 on line 123 for processing by symbol-to-bit decoder 182 and other receiver circuitry (not shown) to recover the actually transmitted data.

The output of slicer 170 is also provided to (ISI) feedback filter FB and adder 16. Feedback filter FB predicts the amount of ISI present in the received signal and provides an ISI prediction signal to adder 15, via line 126. Adder 15, as described above, removes the remaining portion of ISI from the received signal by subtracting the ISI prediction signal from the output signal of feed-forward filter (FF) 160.

Adder 16 subtracts the estimated data symbol provided by slicer 170 from the ISI reduced signal (e1) present on line 127 to provide an ERROR signal (eQ) on line 129. The eQ signal represents the amount of ISI error and channel noise that has not been corrected by the operation of either feed-forward filter FF or feedback filter FB. The eQ signal is used to adapt both feed-forward filter (FF) 160 and feedback filter (FB) 180.

The eQ signal is supplied via line 129 to an input of multiplexer 210. When a control signal (CS) on control line 209 indicates that the noise level is below the clipping (threshold) level, multiplexer 210 passes the eQ signal to its output 212. The eQ signal then adapts filters 160 and 180 via multipliers 111 and 131, respectively.

It is assumed that the adaptation algorithms (not shown) of the feed-forward and feedback filters conform to the use of minimum mean square error (MMSE), zero forcing, or its variations, as known in the art. Multiplier 111 multiplies the ERROR signal (eQ) by a constant or step size, $\alpha1$. The resulting signal provided on line 136 is used to adapt feed-forward (FF) 160. Further, the ERROR signal (eQ) on line 129 is also provided to multiplier 131, which effectively multiplies the ERROR signal by the step size $\alpha2$. The resulting signal provided on line 141 is used to adapt feedback filter (FB) 180.

Thus, when the received signal is within an accepted and anticipated range of values, the receiver system functions as is known in the prior art. However, whenever an impulse noise is received, causing the received signal to exceed a present clipping (or threshold) level, the adaptation of the adaptive filters of the receiver system is inhibited.

In FIG. 1 it is assumed that the threshold detector functions as a comparator providing a signal CS having the second value (i.e., input signal exceeds threshold level) so long as the condition of excessive signal (e.g., impulse noise) exists.

Figure 2:
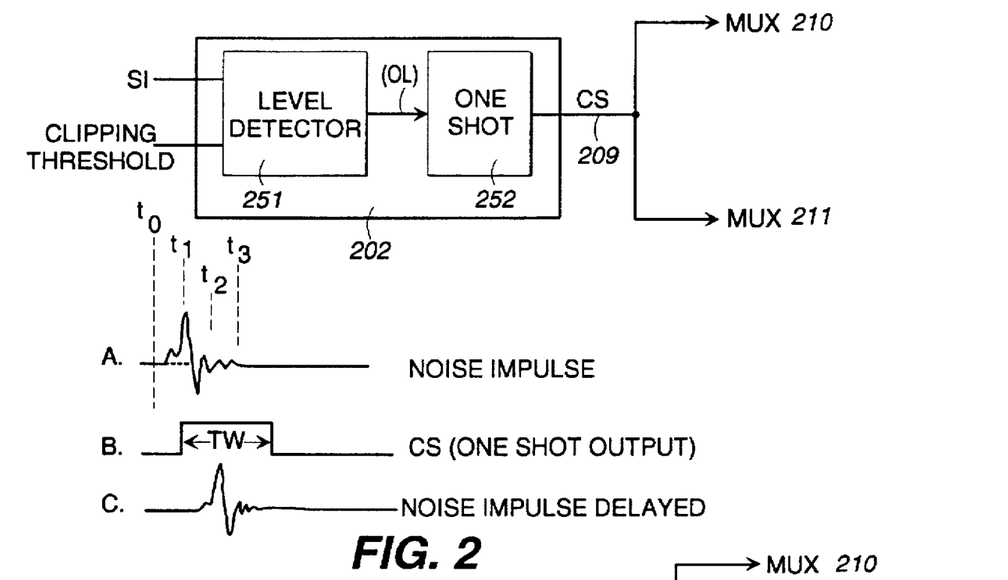
FIG. 2 is a block and waveform diagram of a threshold detector circuit for use in the invention.

FIG. 2 shows a threshold detector 202 comprising a level detector 251 driving a one shot 252. One shot 252 may be a monostable multivibrator or any type of timing circuit or arrangement which produces, or provides, a desired pulse width in response to a triggering input signal. The threshold detector 202 of FIG. 2 is designed to have one shot 252 provide a pulse having a pulse width TW each time a noise impulse is sensed by level detector 251 and its output (OL) goes from the first value (threshold level not exceeded) to the second value (threshold level exceeded). Typically (as shown in waveform A of FIG. 2) a noise impulse has a trailing edge (post cursor) and oscillates about a reference level for a period of time shown to extend from time t1 to t3 in waveform A. The use of a one-shot (e.g., 252) generates a pulse having a width TW to create a window encompassing the full rising and trailing edge of the noise impulse as shown in waveforms B and C of FIG. 2. Thus, in response to a noise impulse, the one-shot generates a pulse during which the adaptive filters of the receiver system are inhibited from adapting. Note that typically the noise impulse also has a precursor (i.e., a period during which the impulse builds up, as shown for time t0 to t1 in waveform A.

A reason for placing a delay network, such as 135, in the signal path is to delay the propagation of the noise impulse and to trigger a one-shot such that most (if not all) of the noise impulse (i.e., the precursor and the postcursor of the noise impulse) occurs within the one-shot period and then has little or no effect on the adaptation of the adaptive filters.

A delay line is generally an expensive component and it is difficult to produce a delay line having the requisite time delay. It is therefore desirable, where possible, to anticipate the occurrence of a noise impulse and use a noise impulse predictor in conjunction with a one-shot like timing circuit to inhibit the adaptive filters.

Figure 3:
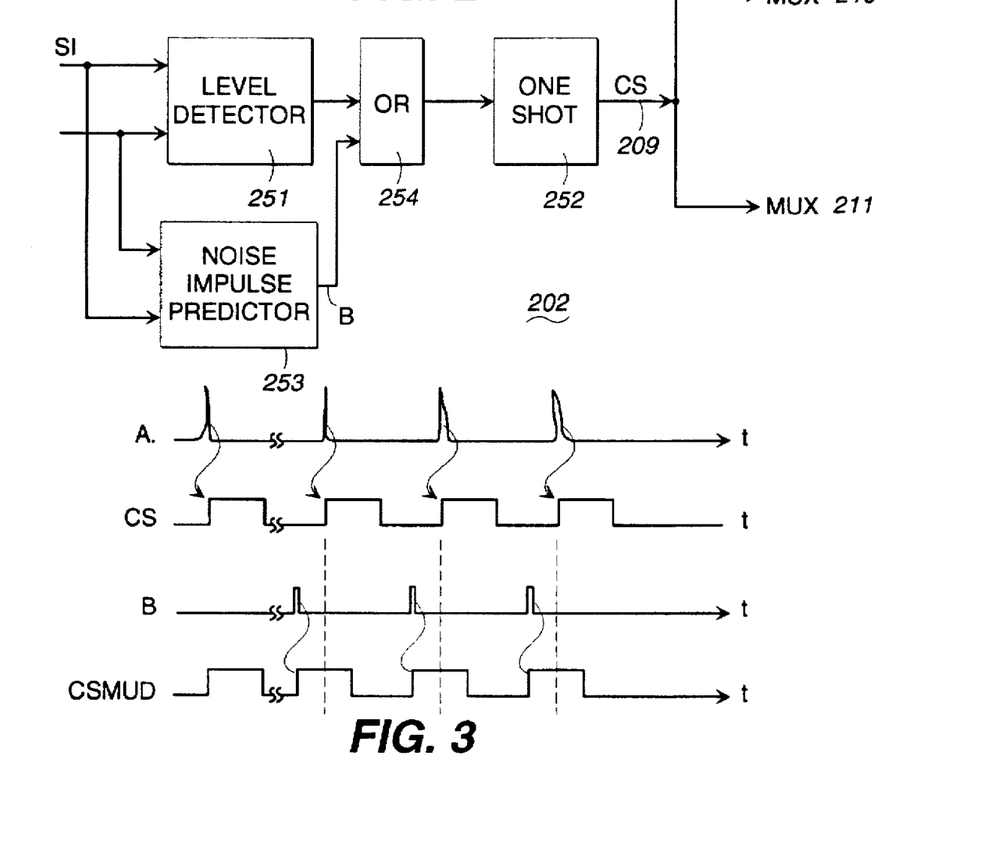
FIG. 3 is another block and waveform diagram of a threshold detector circuit for use in a receiver system embodying the invention.

FIG. 3 shows a threshold detector 202 which includes a noise impulse predictor 253 in addition to the level detector 251 and one shot 252 already shown in FIG. 2. The circuit of FIG. 3 is useful where the noise impulse shown in waveform A of FIG. 3 occurs periodically or may be predicted. In the absence of noise impulse predictor 253, the level detector produces a pulse upon the occurrence of the impulse and triggers one shot 252 to produce a control signal (CS) to MUX210 and MUX211 following each noise impulse as shown in waveform CS of FIG. 3. The rising portion of the noise impulse is allowed through the circuit and may adversely affect the adaptive filters if there is insufficient delay before the filters are inhibited, as discussed above. Thus, where the noise impulse has a repetitive pattern, or its occurrence can be predicted, use is made of noise impulse predictor 253 which functions to produce pulses, as shown in waveform B of FIG. 3, in anticipation of each noise pulse. The anticipatory pulses (B) are coupled through OR gate 254 and trigger one shot 252 causing the signal CS to be modified as shown in the CS MOD waveform in FIG. 3. The resultant pulses shown in the CS MOD waveform become the signals applied to the MUX210 and MUX211. Consequently, the control signal (CS) would inhibit the updating of the adaptive filters of the receiver for a first period of time preceding the occurrence of the noise impulse and a second period of time following the occurrence of the noise impulse. The setting of the coefficients of the adaptive filters of the system are thus rendered relatively impervious to this type (i.e., repetitive or predictable) of noise impulse. Noise impulse predictor 253 may be part of a microcontroller or state machine (not shown) controlling various functions and operations of the receiver system.

In FIG. 1, each adaptive filter (e.g., FF filter 160) is adapted by feeding an error signal (e.g., eQ) or a zero error constant (e.g., EO) to a multiplexer (e.g., 210) and the output of the multiplexer is then fed to a multiplier (e.g., 111) whose output is then used to adapt the coefficients of the filter. This is by way of illustration and it should be appreciated that there are other ways and means to inhibit the adapting of the adaptive filters for selected time periods.

Figures 4, 4A:
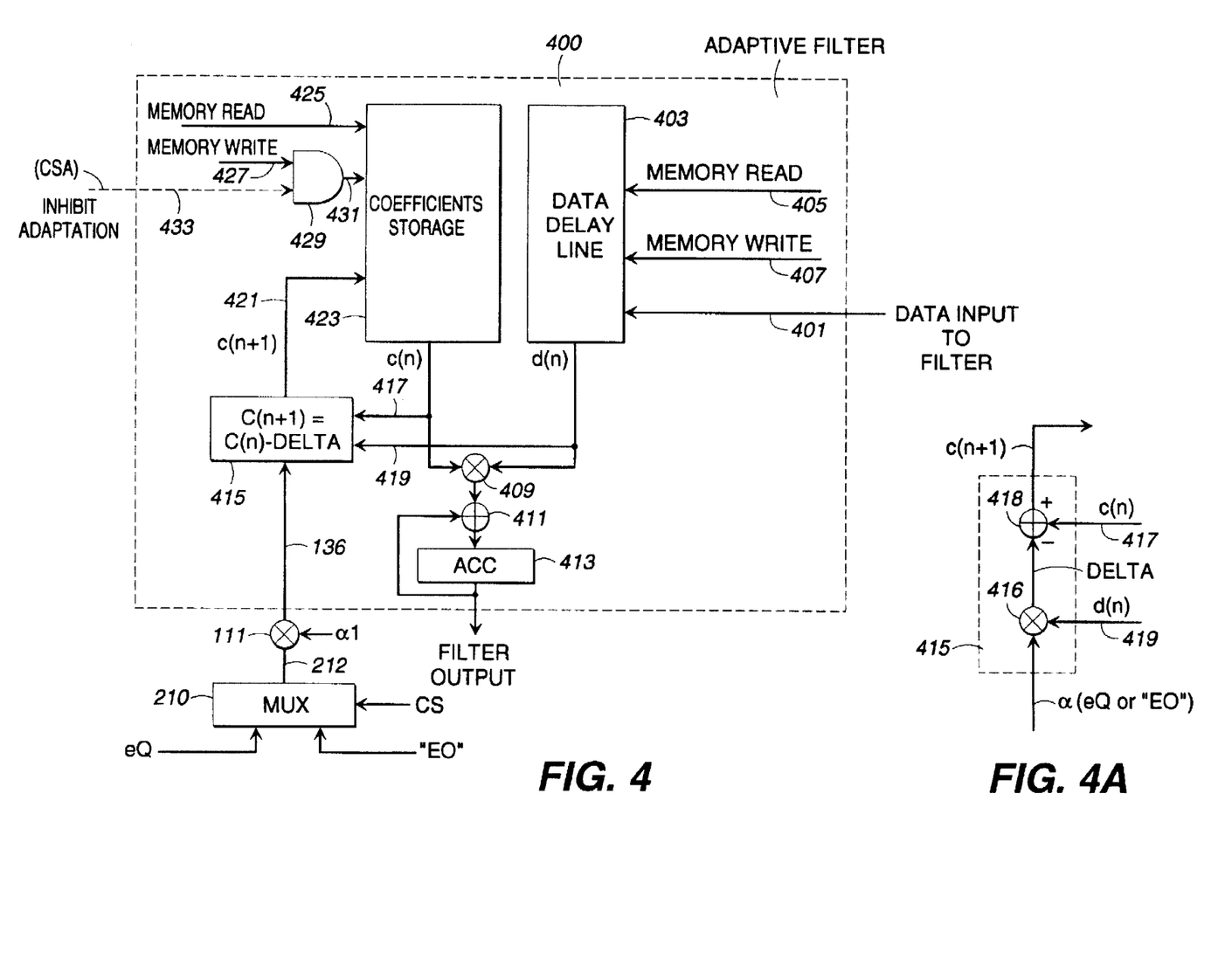
FIG. 4 is a block diagram of an adaptive filter whose adaptation may be inhibited in accordance with the invention.
FIG. 4A is a block diagram of a portion of FIG. 4.

FIG. 4 shows certain details of an adaptive filter 400 which, for purpose of illustration, is assumed to be the feed-forward filter (FF). However, filter 400 may be any other adaptive filter in the transceiver. The data input defines the signal input to the filter. The data input signals on input line 401 are fed to a data delay line 403 which is controlled by a memory read line signal 405 and a memory write line signal 407 generated by a receiver controller circuit (not shown). The data signals d(n) produced by data delay line 403 are output to a multiplier 409. The other input to multiplier 409 is the value of coefficients (cn) provided at the output of coefficient storage 423. The output of multiplier 409 is supplied to adder 411 whose output is supplied to accumulator 413 whose output defines the filter output. One mode of adjusting (changing) the coefficients of the filter 400 includes the application of an error signal (eQ or EO) multiplied by α of multiplier 111 and via line 136 to a coefficient updater 415. Input signals to coefficient updater 415 include the present coefficient value [c(n)] on line 417, the present data value [d(n)] on line 419 and the value of the error signal (eQ or EO) multiplied by the value of α on line 136. Coefficient updater 415 may include a multiplier 416 and an adder 418, as shown in FIG. 4A. Multiplier 416 multiplies the signal (eQ or EO) on line 136 with the data signal d(n) to produce a signal denoted as DELTA. The DELTA signal is subtracted from c(n) in adder 418 to produce c(n+1). Coefficient updater 415 produces a new updated coefficient value [c(n+1)] which may be expressed as follows:

$$c(n+1)=c(n)-(\alpha)(\text{error signal})[d(n)] \qquad \text{eq. 1}$$

That is, a new (updated) value of the filter coefficient [c(n+1)] is equal to the present value of the filter coefficient [c(n)] minus a DELTA; where DELTA is equal to the product of the multiplier (α), the value of the error signal (eQ or EO) and the value of the data input [d(n)].

In accordance with the showing of FIG. 1, the error signal eQ is set to zero (i.e., "EO") when the input signal exceeds a threshold level. It should be noted that instead of setting eQ to zero, the multiplier α may be set to zero such that c(n+1)=c(n). Clearly, any means which causes c(n+1) to be equal to c(n) in response to the detection of a noise impulse exceeding a preset threshold level is within the contemplation of the invention.

Instead of controlling the value of c(n+1), it is possible to allow c(n+1) to vary, but to inhibit its storage and future use, as discussed below. The output [c(n+1)] of coefficient updater 415 is supplied to coefficient storage 423 which is controlled by a memory read line 425 and a memory write line 427. In FIG. 4, memory write line 427 is shown connected to a logic gate 429 whose output on line 431 is applied to coefficient storage 423 to control the writing of the new value c(n+1) into the coefficient storage. According to an aspect of the invention, a control signal (CSA) is applied to logic gate 429 to prevent the storage of c(n+1) in coefficient storage 423 for the period of time that CSA is indicative of a noise impulse exceeding a preset threshold (clipping) level. It should be evident that CSA is derived from detector 202 and that controlling (inhibiting) the storage of the updated value of the filter coefficient is another way of inhibiting adaptation of the coefficients of the adaptive filter when the noise impulse exceeds a desirable threshold level.

In the circuit of FIG. 1, the threshold detection is performed at the output of the A/D converter 134. However, it should be noted that the noise impulse detection can be performed in the analog portion of the circuit at, or before, the input to the A/D converter.

The invention has been illustrated for a single receiver channel but it should be evident that the invention is applicable to multi-channel receiver systems.

It should be evident that the invention is applicable to inhibit adaptation of any adjustable circuit of the system, including the phase-locked loop timing recovery circuit (See block 133 in FIG. 1.). This may be better explained with reference to FIG. 5 which shows more detail of the timing recovery loop.

Figure 5:
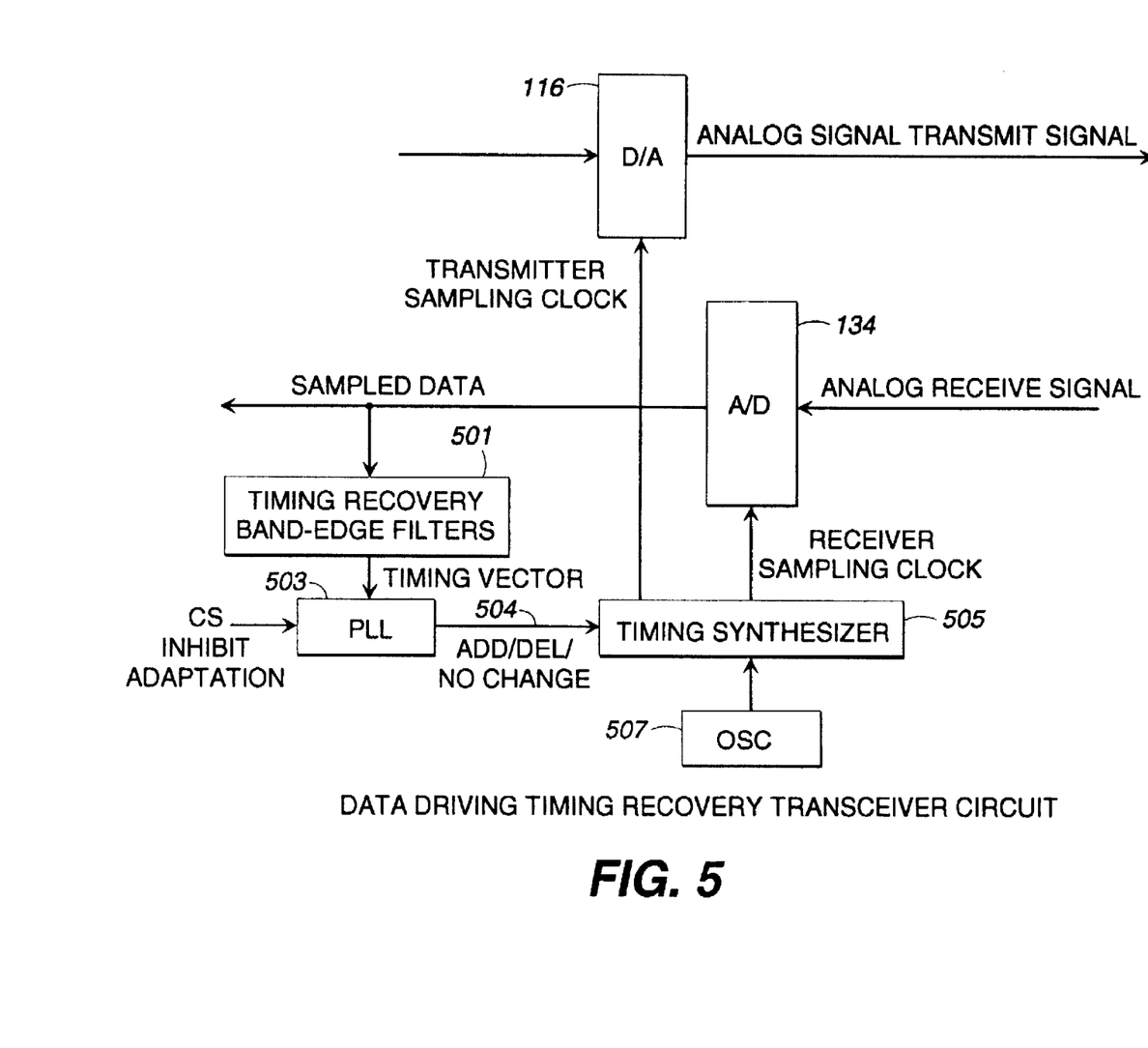
FIG. 5 is a block diagram of a timing recovery circuit in accordance with the invention.

FIG. 5 shows the output of A/D converter 134 connected to timing recovery band edge filters 501 which produce a timing vector applied to phase-locked loop (PLL) circuit 503. In accordance with the invention, PLL 503 is controlled by means of a signal (cs) derived from detector 202. The output 504 of the PLL is supplied to timing synthesizer 505 to which is also supplied a basic clock signal from oscillator 507. Timing synthesizer 505 then produces the receiver sampling clock applied to A/D 134 to sample the received signals and also generates a transmitter sampling clock applied to digital-to-analog converter 116. The PLL 503 (which includes adaptive filtering) provides a signal to synthesizer 505 via line 504 which functions to cause the synthesizer to either increase the frequency of the sampling clock, decrease the frequency of the sampling clock or cause the frequency to remain the same. A noise impulse in the analog receive signal causes distortion in the ouptu of the band edge filters which, in turn, causes the PLL output to shift whereby the receiver sampling clock will not have the exact frequency desired and the received signals will not be sampled at the precisely correct time. Accordingly, the detector 202 supplies a signal to PLL 503 inhibiting the frequency at the output of the synthesize from changing during the presence of a noise impulse.

What is claimed is:

1. A receiver comprising:

an input terminal for receiving input signals;

means coupling an adaptive filter means to said input terminal, said adaptive filter means being normally adjustable as a function of the signals received at said input terminal;

detector means for sensing the amplitude of the input signals received at said input terminal and comparing the amplitude to a threshold level for producing a control signal having first value when the amplitude of the input signal is below the threshold level and having a second value when the amplitude of the input signal exceeds the threshold level;

means responsive to said control signal coupled to said adaptive filter means for preventing adjustment of said adaptive filter means when said control signal has said second value; and means responsive to the expected occurrence of an input signal exceeding the threshold level for producing a control signal coupled to said adaptive filter means for preventing adjustment of said adaptive filter means for a first period of time preceding the expected occurrence of a signal exceeding the threshold level and a second period of time following the expected occurrence of the signal exceeding the threshold level.

2. A receiver as claimed in claim 1, wherein said detector means includes means for producing said control signal having said second value for a predetermined period of time, each time the input signal makes a transition from a value below the threshold level to a value exceeding the threshold level.

3. A receiver as claimed in claim 2, wherein said means for producing said control signal having said second value for a predetermined period of time is a monostable multivibrator.

4. A receiver comprising:

an input terminal for receiving input signals;

means coupling an adaptive filter means to said input terminal, said adaptive filter means being normally adjustable as a function of the signals received at said input terminal;

detector means for sensing the amplitude of the input signals received at said input terminal and comparing the amplitude to a threshold level for producing a control signal having first value when the amplitude of the input signal is below the threshold level and having a second value when the amplitude of the input signal exceeds the threshold level;

means responsive to said control signal coupled to said adaptive filter means for preventing adjustment of said adaptive filter means when said control signal has said second value said means coupling an adaptive filter means to said input terminal includes an analog-to-digital (A/D) converter having an input coupled to said input terminal and having an output; and a delay means coupled between the output of said A/D converter and said adaptive filter means for delaying the application of the received signals to the adaptive filter means; and wherein the output of the A/D converter is coupled to the detector for enabling the detector means to sense the presence of any received signal exceeding the threshold level and inhibiting adjustment of the adaptive filter means prior to the propagation of the signal to the adaptive filter means.

5. A receiver as claimed in claim 4, wherein said adaptive filter means includes:

(a) an echo canceler circuit having an input coupled to said output of said A/D converter; and (b) an adaptive equalizer having an input coupled to said output of said A/D converter.

6. A receiver as claimed in claim 5, wherein each one of said echo canceler and adaptive equalizer includes an adaptive filter having adjustable coefficients, and each adaptive filter includes a means responsive to the signals received by the receiver for producing an error signal which is normally used to adjust the coefficients of its associated filter.

7. A receiver as claimed in claim 5, wherein the output of the A/D converter is coupled via said delay means to one input of a first adder circuit; and wherein said echo canceler includes an echo canceler adaptive filter coupled at its output to another input of the first adder for producing at the output of the first adder a first signal in which an estimated echo signal from the echo canceler adaptive filter is subtracted from echo signals present in the signal at the output of the A/D converter;

wherein the signal at the output of the first adder is fed to the echo canceler adaptive filter for adjusting and updating its coefficients; and wherein any change in the coefficients of the echo canceler adaptive filter is inhibited when the received signal exceeds the predetermined threshold level.

8. A receiver as claimed in claim 7 wherein the output of the first adder is fed to the echo canceler adaptive filter for adjusting its coefficients when the received input signal is below the threshold level and wherein a signal causing no change in the coefficients is fed to the echo canceler adaptive filter when the received input signal exceeds the threshold level.

9. A receiver as claimed in claim 5, wherein the output of the A/D converter is coupled via said delay means to an input of a decision feedback equalizer (DFE) comprising: an adaptive feed-forward filter; an adaptive feedback filter; a slicer circuit; and a first and a second adder circuit.

10. A receiver as claimed in claim 1, further including a timing recovery circuit which provides frequency signals for sampling the input signals, the frequency varying as a function of the amplitude of the received signal; and means responsive to said control signal coupled to said timing recovery circuit for inhibiting any change in frequency during the presence of a received signal exceeding said threshold level.

11. A method for reducing the effect of a noise impulse on the adaptive filter of a receiver system comprising the steps of:

producing a control signal whenever an input signal to the receiver system exceeds a threshold level;

applying the control signal to the adaptive filter of the receiver system for inhibiting a change in the response of the adaptive filter during the presence of an input signal exceeding the threshold level; and responsive to the expected occurrence of an input signal exceeding the threshold level, producing a control signal to inhibit a change in the response of said adaptive filter for a predetermined time preceding the expected occurrence of said input signal exceeding the threshold level.

12. A method as claimed in claim 11, wherein the adaptive filter includes coefficients which are normally adapted as a function of the input signal, and wherein the step of applying the control signal to the adaptive filter for inhibiting a change in the response of the adaptive filter includes inhibiting any change in the coefficients of the adaptive filter.

13. A method as claimed in claim 12, wherein the coefficients of the adaptive filter are normally updated as a function of the product of an error signal, a constant multiplier, and a data signal, and wherein the step for inhibiting any change in the coefficients includes the step of setting the product of the error signal, the constant multiplier and the data signal to zero.

14. A method as claimed in claim 12, wherein the coefficients of the adaptive filter are normally updated as a function the product of an error signal, a constant multiplier, and a data signal, and wherein the step for inhibiting any change in the coefficients includes the step of setting the error signal equal to zero to set the product equal to zero.

15. A method as claimed in claim 12, wherein the coefficients of the adaptive filter are normally updated as a function the product of an error signal, a constant multiplier, and a data signal, and wherein the step for inhibiting any change in the coefficients includes the step of setting the constant multiplier equal to zero to set the product equal to zero.

16. A transmitter receiver system comprising:

an input terminal for receiving input signals;

an adaptive filter means having an input for the application thereto of input signals derived from said input terminal and having an output, said adaptive filter means having coefficients which are normally updated as a function of the input signals and an error signal applied to a control terminal of the adaptive filter means;

means coupling the input of said adaptive filter means to said input terminal;

detector means for sensing the amplitude of the input signals received at said input terminal and comparing the amplitude to a threshold level for producing a control signal having a first value when the amplitude of the input signal is below the threshold level and having a second value when the amplitude of the input signal exceeds the threshold level;

means responsive to said control signal coupled to the control terminal of said adaptive filter means for inhibiting adjustment of said adaptive filter means when said control signal has said second value; and means responsive to the expected occurrence of an input signal exceeding the threshold level for producing a control signal coupled to said control terminal of said adaptive filter means for inhibiting adjustment of said adaptive filter means for a first period of time preceding the expected occurrence of a signal exceeding the threshold level and a second period of time following the expected occurrence of the signal exceeding the threshold level.

17. A receiver as claimed in claim 16, wherein said detector means includes means for producing said control signal having said second value for a predetermined period of time, each time the input signal makes a transition from a value below the threshold level to a value exceeding the threshold level.

18. A transmitter receiver system comprising:

an input terminal for receiving input signals;

an adaptive filter means having an input for the application thereto of input signals derived from said input terminal and having an output, said adaptive filter means having coefficients which are normally updated as a function of the input signals and an error signal applied to a control terminal of the adaptive filter means;

means coupling the input of said adaptive filter means to said input terminal;

detector means for sensing the amplitude of the input signals received at said input terminal and comparing the amplitude to a threshold level for producing a control signal having a first value when the amplitude of the input signal is below the threshold level and having a second value when the amplitude of the input signal exceeds the threshold level;

means responsive to said control signal coupled to the control terminal of said adaptive filter means for inhibiting adjustment of said adaptive filter means when said control signal has said second value;

said means coupling the input of said adaptive filter means to said input terminal includes an analog-to-digital (A/D) converter having an input coupled to said input terminal and having an output; and a delay means coupled between the output of said A/D converter and the onput of said adaptive filter means for delaying the application of the received signals to the adaptive filter means; and wherein the output of the A/D converter is coupled to the detector for enabling the detector means to sense the presence of any received signal exceeding the threshold level and inhibiting adjustment of the adaptive filter means prior to the propagation of the signal to the adaptive filter means.

19. A receiver as claimed in claim 18, wherein said adaptive filter means includes:

(a) an echo canceler circuit having an input coupled to said output of said A/D converter; and (b) an adaptive equalizer having an input coupled to said output of said A/D converter.

20. A receiver as claimed in claim 19, wherein each one of said echo canceler and adaptive equalizer includes an adaptive filter having adjustable coefficients, and each adaptive filter includes a means responsive to the input signals for producing an error signal coupled to said control terminal for normally adjusting the coefficients of its associated filter.

21. A receiver as claimed in claim 19, wherein the output of the A/D converter is coupled via said delay means to one input of a first adder circuit; and wherein said echo canceler includes an echo canceler adaptive filter coupled at its output to another input of the first adder for producing at the output of the first adder a first signal in which an estimated echo signal from the echo canceler adaptive filter is subtracted from echo signals present in the signal at the output of the A/D converter;

wherein the signal at the output of the first adder is fed to the control terminal of the echo canceler adaptive filter for adjusting and updating its coefficients; and wherein any change in the coefficients of the echo canceler adaptive filter is inhibited when the received signal exceeds the predetermined threshold level.

22. A receiver as claimed in claim 21 wherein the output of the first adder is fed to the echo canceler adaptive filter for adjusting its coefficients when the received input signal is below the threshold level and wherein a signal causing no change in the coefficients is fed to the echo canceler adaptive filter when the received input signal exceeds the threshold level.

23. A receiver as claimed in claim 21, wherein the output of the A/D converter is coupled via said delay means to an input of a decision feedback equalizer (DFE) comprising: an adaptive feed-forward filter; an adaptive feedback filter; a slicer circuit; and a first and a second adder circuit.

24. A receiver comprising:

an input terminal for receiving analog signals;

an analog-to-digital (A/D) converter having an input coupled to said input terminal and having an output;

an echo canceler coupled to the output of said A/D converter, said echo canceler including a first adaptive filter means adjustable as a function of the amplitude of the signal at the output of said A/D converter;

an adaptive equalizer coupled to the output of said A/D converter for processing and propagating the signal produced at the output of said A/D converter, said adaptive equalizer, including a second adaptive filter means adjustable as a function of the amplitude of the signal at the output of said A/D converter;

detector means coupled between the output of said A/D converter and said first and second adaptive filter means for sensing when amplitude of the signal at the output of the A/D converter exceeds a predetermined value for inhibiting the adjustment of the first and second adaptive filter means when the signal exceeds the predetermined value; and means responsive to the detector means for inhibiting the adjustment of the first and second adaptive filter means for a first time period before the signal exceeds the predetermined value, and continuing the inhibition of the adjustment of the first and second adaptive filter means for a second period of time after the signal drops below the predetermined threshold level.

25. A receiver as claimed in claim 24, wherein said detector means includes a threshold detector having an input coupled to the output of the A/D converter and having another input to which is applied a predetermined threshold level, wherein when the signal at the output of the A/D converter is below the threshold level, the threshold detector produces a control signal having a first value and when the signal at the output of the A/D converter is above the threshold level, the threshold detector produces a control signal having a second value; and wherein when the control signal has said second value it inhibits the adjustment of the first and second adaptive filter means.

26. A receiver as claimed in claim 25, wherein the threshold detector produces a control signal having said second value for a preset period of time whenever the output signal of the A/D converter exceeds the threshold level.

27. A receiver as claimed in claim 24, further including a timing recovery circuit which provides frequency signals for sampling the input signals applied to the A/D converter, the frequency signals varying as a function of the amplitude of the received signal; and means responsive to said control signal coupled to said timing recovery circuit for inhibiting any change in frequency during the presence of a received signal exceeding said threshold level.

* * * * *